(12) United States Patent
Quinn (10) Patent No.: US 9,048,860 B1
(45) Date of Patent: Jun. 2, 2015

(54) SUCCESSIVE APPROXIMATION ANALOG-TO-DIGITAL CONVERSION

(71) Applicant: Xilinx, Inc., San Jose, CA (US)

(72) Inventor: Patrick J. Quinn, Dublin (IE)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/297,161

(22) Filed: Jun. 5, 2014

(51) Int. Cl.
*H03M 1/66* (2006.01)
*H03M 1/46* (2006.01)
*H03M 1/12* (2006.01)
*H03M 1/38* (2006.01)

(52) U.S. Cl.
CPC ........ *H03M 1/46* (2013.01); *H03M 1/12* (2013.01); *H03M 1/38* (2013.01)

(58) Field of Classification Search
CPC ............ H03M 1/12; H03M 1/38; H03M 1/46
USPC .................. 341/144, 155, 161, 163
See application file for complete search history.

(56) References Cited

U.S. PATENT DOCUMENTS

| | | | |
|---|---|---|---|
| 7,209,069 B2 * | 4/2007 | Felder ........................... | 341/163 |
| 7,466,252 B1 | 12/2008 | Radulov et al. | |
| 7,961,132 B1 * | 6/2011 | Perry et al. ................... | 341/172 |
| 8,659,460 B2 * | 2/2014 | Nani et al. ..................... | 341/155 |
| 8,797,204 B2 * | 8/2014 | Yoon et al. .................... | 341/172 |
| 8,866,653 B2 * | 10/2014 | Tsai et al. ..................... | 341/122 |

OTHER PUBLICATIONS

Maloberti, Franco, *Data Converters*, Jan. 1, 2007, pp. 178-184, Springer, Dordrecht, The Netherlands.
Manganaro, Gabriele, *Advanced Data Converters*, Jan. 1, 2012, pp. 54-69, Cambridge University Press, New York, New York, USA.
Pelgrom, Marcel J.M., *Analog-to-Digital Converters*, Jan. 1, 2010, pp. 296-300, Springer, Dordrecht, The Netherlands.

* cited by examiner

*Primary Examiner* — Brian Young
(74) *Attorney, Agent, or Firm* — W. Eric Webostad (57) ABSTRACT

An apparatus relating generally to an analog-to-digital converter ("ADC") is disclosed. In such an apparatus, the ADC is configured for successive approximations. The ADC includes a digital-to-analog converter ("DAC"), a comparator, and a control block. The DAC is coupled to receive a reference input signal and coupled to provide an analog output signal. The analog output signal is capacitively coupled to an analog input node through a capacitor. The capacitor is coupled between the DAC and the comparator to provide capacitive coupling therebetween. The comparator is coupled to the analog input node. The comparator is further coupled to provide a comparator output signal to the control block. The control block is configured for successive approximations to provide a digital output signal to a digital output node. The DAC is coupled to the digital output node to receive the digital output signal as a feedback input signal.

19 Claims, 5 Drawing Sheets

SUCCESSIVE APPROXIMATION ANALOG-TO-DIGITAL CONVERSION

TECHNICAL FIELD

The following description relates to integrated circuit devices ("ICs"). More particularly, the following description relates to successive approximation analog-to-digital conversion for an IC.

BACKGROUND

There are many types of analog-to-digital converters ("ADCs"). Examples of ADCs include successive-approximation-register ADCs ("SAR ADCs"), pipelined ADCs, flash ADCs, and sigma-delta ADCs, among others. A conventional SAR ADC may include a sample and hold circuit ("S/H") (also known as a track and hold circuit), a digital-to-analog converter ("DAC"), a comparator, a register, and SAR logic.

A conventional SAR ADC may include a switched capacitor DAC having an array of N capacitors of binarily weighted values. Unfortunately, such N capacitors conventionally may be associated with substantial calibration overhead and space consumption. Furthermore, clock buffers may have to be scaled accordingly to such N binarily weighted capacitors, which may add to the overall complexity and overhead as frequency is increased. For these reasons, conventional SAR ADCs may be frequency limited to lower operational frequencies than needed for many applications.

Accordingly, it would be desirable and useful to provide a SAR ADC that overcomes one or more of the above-described limitations of a conventional SAR ADC.

SUMMARY

An apparatus relates generally to an analog-to-digital converter ("ADC"). In such an apparatus, the ADC is configured for successive approximations. The ADC includes a digital-to-analog converter ("DAC"), a comparator, and a control block. The DAC is coupled to receive a first reference input signal and a feedback input signal to provide an analog output signal. The analog output signal is capacitively coupled to an analog input node through a capacitor. The analog input node is coupled through a switch to sample an analog input signal. The capacitor is coupled between an output port of the DAC and a first input port of the comparator to provide capacitive coupling therebetween. The first input port of the comparator is further coupled to the analog input node. A second input port of the comparator is coupled to receive a second reference input signal. The comparator is coupled to provide a comparator output signal to the control block. The control block is configured for successive approximations to provide a digital output signal to a digital output node. The DAC is coupled to the digital output node to receive the digital output signal as the feedback input signal.

Another apparatus relates generally to another ADC. In such an apparatus, the ADC is configured for successive approximations. The ADC includes a DAC, a comparator, and a control block. The DAC is coupled to receive a reference input signal. The DAC is further coupled to provide a first analog output signal and a second analog output signal as a differential output. The first analog output signal is capacitively coupled to a first analog input node through a first capacitor. The second analog output signal is capacitively coupled to a second analog input node through a second capacitor. The first capacitor is coupled between the DAC and the comparator to provide a first capacitive coupling therebetween. The second capacitor is coupled between the DAC and the comparator to provide a second capacitive coupling therebetween. The comparator is coupled to the first analog input node and coupled to provide a first comparator output signal to the control block. The comparator is coupled to the second analog input node and coupled to provide a second comparator output signal to the control block. The control block is configured for successive approximations to provide a first digital output signal to a first digital output node and to provide a second digital output signal to a second digital output node. The DAC is coupled to the first digital output node and the second digital output node to respectively receive the first digital output signal as a first feedback input signal and the second digital output signal as a second feedback input signal.

A method relates generally to an ADC. In such a method, a reference input is obtained by a DAC of the ADC. An analog input is received and sampled by the ADC. Each sample of the analog input is input to a comparator of the ADC. An analog output of the DAC is capacitively coupled to the comparator of the ADC. The comparator compares the analog output of the DAC capacitively coupled with the sample input. Comparison by the comparator is against an offset of the analog output of the DAC. A comparator output from the comparator is output as a digital input to a control block of the ADC. The control block approximates the analog input sampled using digital inputs from the comparator outputs for conversion of the analog input sampled to a digital output. The digital output is output to an output interface.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numbers are used in different diagrams to refer to the same items; however, in alternative examples the items may be different.

Before describing the examples illustratively depicted in the several figures, a general introduction is provided to further understanding.

High-speed analog-to-digital conversion with high resolution has been problematic with conventional capacitively switched successively accumulated registered analog-to-digital conversion. As described below in additional detail, analog-to-digital conversion is provided for high-speed applications for medium to high resolution, such as 8 bits or higher for example, by an analog-to-digital converter ("ADC") configured for successive approximations using (unswitched) AC capacitive coupling between a digital-to-analog converter ("DAC") and a comparator of the ADC.

With the above general understanding borne in mind, various configurations for successive approximation analog-to-digital conversions are generally described below.

Figure 1:
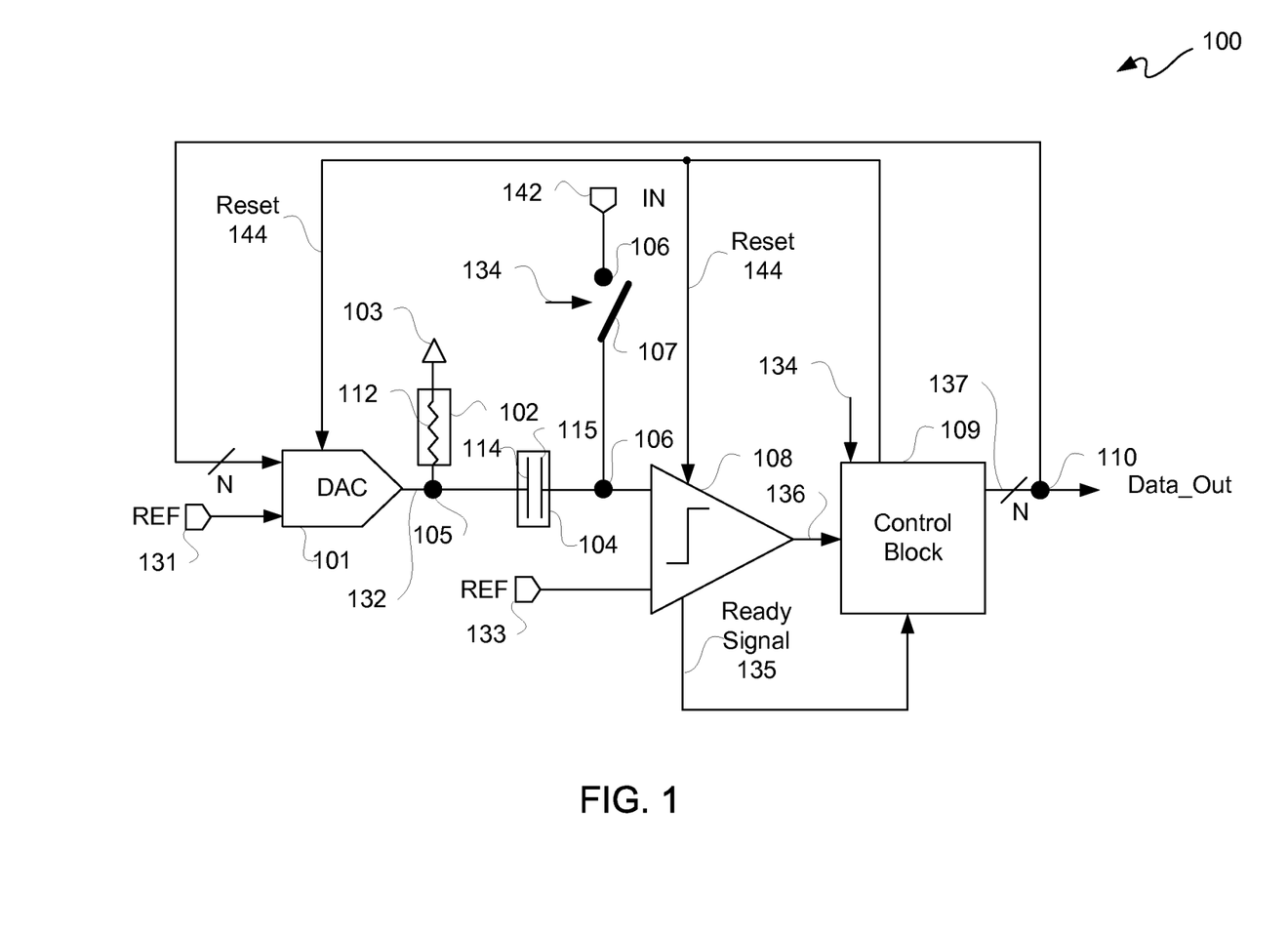
FIG. 1 is a schematic diagram depicting an exemplary analog-to-digital converter ("ADC") configured for successive approximations for a single-ended output.

FIG. 1 is a schematic diagram depicting an exemplary analog-to-digital converter ("ADC") 100 configured for successive approximations for a single-ended output. ADC 100 includes a digital-to-analog converter ("DAC") 101, a comparator 108, and a control block 109. Control block 109 may include registers configured for successive approximations for outputting an N-bit digital output signal 137 for N a positive integer greater than zero, as described below in additional detail.

DAC 101 may be coupled to receive a reference input signal 131 and configured to provide an analog output signal 132. DAC 101 may be coupled to provide analog output signal 132 to an interim node 105. DAC 101 may be a single-ended current steering DAC. However, in other examples, DAC 101 may be a resistive DAC or a switched-capacitor DAC. However, with a current switching DAC or IDAC 101, current is output. In this example, switched current is output from IDAC 101 to a resistive termination ("resistor") 112 to provide an equivalent voltage to a terminal 114 of capacitor 104 for unswitched AC capacitive coupling to a comparator 108.

Analog output signal 132 provided to interim node 105 may be capacitively coupled to an analog input node 106 through a capacitor 104. A termination resistance device 102 may be internal with respect to an IC in which ADC 100 is located. Optionally, termination resistance device 102 may be externally coupled to an IC in which ADC 100 is located. In another example, output signal 132 of IDAC 101 may be fed to a transformer with secondary side resistive termination, such as for example to provide an optimal impedance termination for an IDAC while at the same time creating a large output swing for a following stage. Termination resistance device 102 may be coupled between a ground node or bus 103 and interim node 105. In this example, termination resistance device 102 is a resistor 112. However, another type of termination resistance device 102 may be used as is known.

Capacitor 104 may be coupled between an output port of DAC 101 and an input port of comparator 108. Effectively, analog output signal 132 may be a Class A output as capacitor 104 may electrically float to provide capacitive coupling between an output port of DAC 101 and an analog input node 106. In other words, capacitor 104 need not be directly coupled to a supply voltage node, a ground node, or a reference voltage node, and so noise associated with any or all of such nodes may be avoided. Stated yet another way, capacitor 104 is coupled in series as an AC coupling capacitor between an output port of DAC 101 and an analog input node 106. In other words, an unswitched AC capacitive coupling may be used. In this example, capacitor 104 has two spaced apart plates, where a top plate 115 of capacitor 104 is directly coupled to analog input node 106 and where a bottom plate 114 of capacitor 104 is directly coupled to an output port of DAC 101. Having top plate 115 directly coupled to analog input node 106 may be used to provide extra headroom in order to extend an input signal range and therefore the effective resolution of ADC 100. Along those lines, plate parasitic capacitance at a comparator input may attenuate a signal and may provide a coupling path for noise. Generally, top plate 115 has much less of either or both of these issues than bottom plate 114.

An input port of comparator 108 may be coupled to analog input node 106 to receive a capacitively coupled analog output signal 132, and another input port of comparator 108 may be coupled to receive another reference input signal 133. Reference input signals 131 and 133 may be the same or different signals. However, reference input signal 133 is a voltage reference, whereas reference input signal 131 may be either a current reference or a voltage reference depending on the configuration of DAC 101.

An output port of comparator 108 may be coupled to provide a digital output signal 136 to a control block 109. Again, control block 109 may be configured as a successive approximations register ("SAR"), which may include a series of registers for N bits. Accordingly, control block 109 may output an N-bit digital output signal 137 to digital output node 110 of an output interface to provide digital output data.

DAC 101 may be coupled to digital output node 110 to receive digital output signal 137 as a feedback input signal 137. DAC 101 may have a separate current steering switch for each of such N-bits, from an MSB to an LSB of such N-bits. In another configuration, ADCs 100 may be cascaded, where each ADC 100 is a 1-bit ADC. However, for purposes of clarity by way of example and not limitation, it shall be assumed that ADC 100 is an 8-bit ADC although fewer or more than 8 bits may be used in other configurations. As described below in additional detail, for a differential configuration, DAC 101 may have a separate current steering switch for each bit of such N-bits, where one set of bits are used for a single current switching stage to drive current output to a positive, P, side or rail or to a negative, N, side or rail to provide a full differential output, in contrast to a pseudo differential as in a switched-capacitor or capacitive bank DAC.

A data input port may be coupled through switch 107 to receive an analog input signal 142 for conversion to digital output signal 137. Switch 107, which may be formed of one or more transistors, may be clocked at a sampling clock frequency of a sampling clock signal 134. Additionally, registers of control block 109 may be clocked in relation to sampling clock signal 134. Along those lines, in a clocked, synchronous SAR, registers of control block 109 may be clocked at a rate of N-times a sample clock frequency of sampling clock signal 134 so that a full N-bit digital approximation of an analog input signal sample of analog input signal 142 may be available at the end of each sample clock period. A single instance of a switch 107, or single instances of respective switches for a differential configuration as described below in additional detail, may be used for taking in new analog samples at the start of each bit trial sequence.

When switch 137 is closed, data on analog input signal 142 may be passed to analog input node 106. For a self-timed configuration, DAC 101 and comparator 108 may receive a reset signal 144 from SAR control logic in control logic block 109, and comparator 108 may provide a ready signal 135 to control block 109, as described below in additional detail. However, rather than an asynchronous configuration as described herein, DAC 101, comparator 108, and control block 109 may all be clocked responsive to a clock signal for synchronous operation responsive to a sampling clock signal 134. For purposes of clarity by way of example and not limitation, it shall be assumed that reset signal 144 and ready signal 135 are used to provide a self-timed asynchronous configuration, even though in other implementations a synchronous configuration may be used. In this example, SAR control logic in control block 109 provides a reset signal 144 to both comparator 108 and DAC 101. Optionally, reset signal 144 may not be provided to DAC 101, since when a reset is asserted, associated data has settled to its "new" value, at which point in time such "new" data may have been clocked in by DAC 101. Along those lines, a reset signal may not need to be used to clock in data to DAC 101. However, for purposes of clarity and not limitation, it shall be assumed that reset signal 144 is provided to DAC 101 to effectively clock data therein.

Effectively, ADC 100 may be a switched-current successive-approximation-register ADC for an IDAC implementation of DAC 101. Comparator 108, as described above, may be coupled to sample against an offset of DAC 101. Capacitor 104 may effectively memorize such offset over time to remove such offset when input to comparator 108, namely use of capacitor 104 provides for self-correction. Along those lines, no sample and hold (or sample and track) circuit is required, which significantly reduces overhead in comparison to a conventional SAR ADC. Furthermore, ADC 100 may have a single output capacitor 104, which is substantially fewer in number than the number of capacitors in a conventional switched capacitor DAC. Furthermore, calibrating, sizing, matching and other complexity associated with switched capacitors is avoided.

Figure 2:
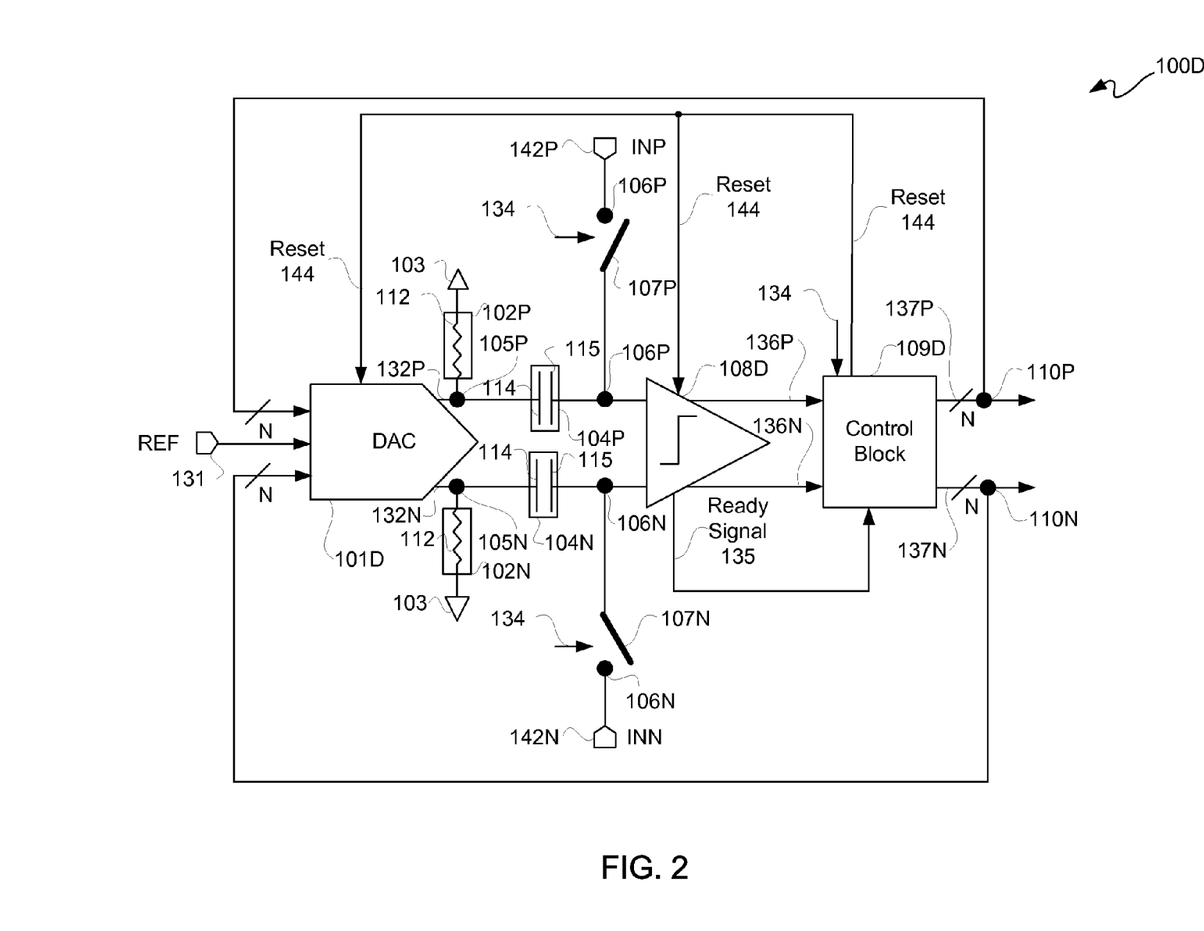
FIG. 2 is a schematic diagram depicting an exemplary ADC configured for successive approximations for a differential output.

FIG. 2 is a schematic diagram depicting an ADC 100D configured for successive approximations for a differential output. As generally components of ADCs 100 and 100D of FIGS. 1 and 2 are same or similar, in FIG. 2 generally same reference numbers are used as in FIG. 1 for purposes of clarity but with "D" for differential, "P" for positive side or rail, and "N" for negative side or rail.

ADC 100 includes a differential DAC 101D, a differential comparator 108D, and a control block 109D, where control block 109D may be configured with corresponding sets of registers for differential successive approximations. Control block 109D may include sets of registers configured for successive approximations for outputting N-bit digital output signals 137P and 137N for N a positive integer greater than zero, as described below in additional detail.

DAC 101D may be coupled to receive a reference input signal 131 and configured to provide analog output signals 132P and 132N. DAC 101D may be coupled to provide signals 132P and 132N respectively to interim nodes 105P and 105N. DAC 101D may be a differential current steering DAC. However, in other examples, DAC 101D may be a resistive DAC or a switched-capacitor DAC. However, with a current switching DAC or IDAC 101D, current is switch.

Analog output signals 132P and 132N respectively provided to interim nodes 105P and 105N may be correspondingly capacitively coupled to analog input nodes 106P and 106N through capacitor 104P and 104N, respectively. Termination resistance devices 102P and 102N may be internal with respect to an IC in which ADC 100D is located. Optionally, termination resistance devices 102P and 102N may be externally coupled to an IC in which ADC 100D is located. Termination resistance devices 102P and 102N may be coupled between a ground node or bus 103 and interim nodes 105P and 105N, respectively. In this example, termination resistance devices 102P and 102 N are respective resistors 112. However, another type of termination resistance device may be used as is known.

Capacitor 104P may be coupled between a positive side output port of DAC 101D and an input port of comparator 108D, and capacitor 104N may be coupled between a negative side output port of DAC 101D and another input port of comparator 108D. Effectively analog output signals 132P and 132N may be a Class A output as capacitors 104P and 104N may each electrically float to provide capacitive coupling between output ports of DAC 101D and analog input nodes 106P and 106N, respectively. In other words, capacitors 104P and 104N need not be directly coupled to any one or more of a supply voltage node, a ground node, or a reference voltage node, and so noise associated with any or all of such nodes may be avoided. Stated yet another way, capacitor 104P is coupled in series as an AC coupling capacitor between an output port of DAC 101D and a load, namely analog input node 106P directly coupled to an input port of comparator 108D. Likewise, capacitor 104N is coupled in series as an AC coupling capacitor between another output port of DAC 101D and a load, namely analog input node 106N directly coupled to another input port of comparator 108D.

In this example, each capacitor 104P and 104N has two spaced apart plates, where a top plate 115 of each is directly coupled to a corresponding analog input node, and where a bottom plate 114 of each is directly coupled to a corresponding output port of DAC 101D. Having top plates 115 respectively directly capacitively coupled to analog input node 106P and 106N may provide extra headroom. Having top plates 115 of capacitors 104P and 104N respectively directly coupled to analog input node 106P and 106N may be used to provide extra headroom in order to extend an input signal range and therefore the effective resolution of ADC 100D. Generally, capacitive coupling in this application means that an input stage of comparator 108 may be placed at a different, such as a more optimal, DC level than an output stage of DAC 101, so as to improve overall efficiency of ADC 100 by increasing signal range and increasing signal-to-noise ratio ("SNR"). This may be particularly useful for current steering DACs, which have their outputs referenced to either supply or ground through their termination resistors which are either supply or ground referenced. However, in another configuration, bottom plates 114 of capacitors 104P and 104N may respectively be coupled to analog input nodes 106P and 106N.

An input port of comparator 108D may be coupled to analog input node 106P to receive a capacitively coupled analog output signal 132P, and another input port of comparator 108D may be coupled to analog input node 106N to receive a capacitively coupled analog output signal 132N. Reference input signal 131 may be either a current reference or a voltage reference depending on configuration of DAC 101D. For purposes of clarity by way of example and not limitation, DAC 101D is assumed to be a current steering DAC, and so reference input signal 131 may be a steady state or constant signal to provide a fixed current or amperage reference.

Positive- and negative-side output ports of comparator 108D may be coupled to respectively provide a differential output of comparator digital output signals 136P and 136D to a control block 109D. Again, control block 109D may be configured as a successive approximations register ("SAR") for differential signaling, which may include two series of register for N bits each. Accordingly, control block 109D may output N-bit digital output signals 137P and 137N respectively to digital output nodes 110P and 110N of an output interface to provide differential digital output data. As described herein, a fully-differential output may be sourced from digital output nodes 110P and 110N to provide differential digital output data.

DAC 101D may be coupled to digital output nodes 110P and 110N to receive digital output signals 137P and 137N respectively therefrom as separate feedback input signals 137P and 137N for input to DAC 101D along with reference input signal 131. DAC 101D may have a separate current steering switch for each set of such N-bits, from an MSB to an LSB of each such N-bits; however, for differential signaling a same set of such switches may be used for both positive and negative sides, as described below in additional detail. In another configuration, ADCs 100D may be cascaded, where each ADC 100D is a 1-bit ADC. However, for purposes of clarity by way of example and not limitation, it shall be assumed that ADC 100D is an 8-bit ADC through fewer or more than 8 bits may be used in other configurations. For a differential configuration, DAC 101D may have a separate current steering switch for each bit of such N-bits, where one set of bits are used for a single current switching stage to drive current output to a positive, P, side or rail or to a negative, N, side or rail to provide a full differential output, in contrast to a pseudo differential as in a switched-capacitor or capacitive bank DAC.

A positive side data input port may be coupled through a switch 107P to receive an analog input signal 142P for conversion to digital output signal 137P, and a negative side data input port may be coupled through a switch 107N to receive an analog input signal 142N for conversion to digital output signal 137N. Switches 107P and 107N, each of which may be formed of one or more transistors, may both be clocked at a sampling clock frequency of a sampling clock signal 134. Additionally, registers of control block 109D may be clocked responsive to sampling clock signal 134. Again, there may be single instances of each of switches 107P and 107N.

When switches 137P and 137N are closed, differential data on analog input signals 142P and 142N may be passed to analog input nodes 106P and 106N, respectively. For a self-timed configuration, DAC 101D and comparator 108D may receive a reset signal 144 from SAR control logic in control block 109, and comparator 108D may provide a ready signal 135 to control block 109D, as described below in additional detail. However, rather than an asynchronous configuration as described herein, optionally DAC 101D, comparator 108D, and control block 109D may all be clocked responsive to clock signals for synchronous operation responsive to a sampling clock signal 134. For purposes of clarity by way of example and not limitation, it shall be assumed that reset signal 144 and ready signal 135 are used to provide a self-timed asynchronous configuration, even though in other implementations a synchronous configuration may be used.

Effectively, ADC 100D may be a switched-current successive-approximation-register ADC for an IDAC implementation of DAC 101D. Comparator 108D, as described above, may be coupled to sample against an offset of DAC 101D. Capacitors 104P and 104N may effectively memorize such offset over time to effectively remove such offset when input to comparator 108D, namely use of capacitors 104P and 104N provides for self-correction. Comparator 108D may be coupled to sample against an offset of DAC 101D. Along those lines, no sample and hold (or sample and track) circuit is required, which significantly reduced overhead in comparison to a conventional SAR ADC. Furthermore, in this example, ADC 100D has only two output capacitors 104P and 104N, which is substantially fewer capacitors than a switched capacitor DAC. Furthermore, calibrating, sizing, and other complexity associated with switched capacitors is avoided. Along those lines, capacitors 104P and 104N do not require accurate matching, as charge is neither redistributed nor shared with other capacitors as in a switch-capacitor DAC for example. This substantially reduces the complexity associated with fabrication of capacitors for an ADC 101D. Additionally, only one set of switches 107P and 107N may be used to interconnect a differential input of analog output signals 132P and 132N to capacitors 104P and 104N, respectively, such as top plates 115 of each thereof. As reference for ADC 100D is a current reference of current steering DAC 101D, low-drop-out ("LDO") regulator or other power supply regulation may be avoided. In an implementation, capacitors 104P and 104N may be Metal-Oxide-Metal or Metal-Insulator-Metal, namely MOM or MIM, capacitors to reduce or avoid voltage dependency. Furthermore, for an example of a current steering DAC with class A current outputs, such a DAC may generally be immune to noise on a supply and a ground. As capacitors 104P and 104N are not supply or ground referenced, need for an accurately regulated supply may be obviated or at least substantially reduced.

Because an implementation of ADC 100D is substantially robust with respect to external noise due to being truly fully differential and having a Class A output, ADC 100D is suitable for integration onto a same substrate as noisy digital structures, such as in a System-on-a-Chip ("SoC") including an FPGA for example. Notably, however, the apparatus and methods described herein are not limited to implementation in SoCs or with FPGAs or other PLDs.

A server loop may be created between output of DAC 101D and input of comparator 108D. Analog input signals 142P and 142N may be sampled through a series of switches, while DAC 101D is pre-set to a mid-scale position, namely about the middle of N-bits as between an MSB and an LSB such as an MSB/2 input level. Hence, there is no initial settling needed since the MSB may already be in place for comparison to an input signal and an accurate comparison can be made with an input signal on an initial conversion cycle. There is no shorting switch across DAC 101D outputs, and so DAC 101D may be pre-sampled across capacitors 104P and 104N. Because for the final bit trial of ADC 100D, a final setting of DAC 101D may include the same DAC offset. This offset may be cancelled by an initial sampled DAC offset on capacitors 104P and 104N.

DAC 101D may be configured for binary or other current steering scaling. Because of having a reduced footprint, ADC 100D may fit into a small area. Additionally, ADC 100D may have a small sampling capacitance due to being able to operate with a large voltage swing for reduced power consumption. Capacitor size may generally be determined responsive only to noise considerations and not matching. For example, in an implementation, sampling capacitance size may be 100 fF or less, for power consumption of 30 mW or less for an 8-bit ADC 100 when operating at approximately 1 giga-sample per second. While speed of operation of an ADC may vary with respect to semiconductor process node, for example for a 16 nm semiconductor process, an 8-bit ADC 100D may have an internal clock speed of 10 GHz for a sample rate of 1.25 (i.e., 10 GHz/8) giga-samples per second assuming no clock overhead; however, these or other values may be used in other examples. Effective resolution or dynamic range can be increased to very high levels by increasing sizes of sampling capacitor 104P and 104N to reduce thermal noise together with widening the number of bits in DAC 101D. Even though a binary DAC 101D may be selected for its very small size and fast speed, other types of scaling or a combination of types of scaling may be used for conversion.

Effectively, ADC 100D has three nodes, namely a differential input node formed by analog input nodes 106P and 106N, a differential output node formed by digital output nodes 110P and 110N, and a reference input node or reference input signal 131. Having sampling into capacitively coupled input nodes of a comparator 108D for a Class A output from DAC 101D for small capacitances facilitates such an increase in operational speed of an ADC 100D. Furthermore, starting out at a suitable reference level with excursions up or down likewise increase operational speed.

Control block 109D may include a delay line for self-timing to sequence from bit-to-bit through N-bits. Additionally comparator 108D may include a ready detector for self-timed operation to provide ready signal 135. A ready detector may be configured to assert ready signal 135 when comparator 108D is on its way to make a decision and not still in a metastable state. Settling time of DAC 101D may be used to assert reset signal 144. Along those lines, SAR control logic in control block 109 may provide reset signal 144 to both comparator 108D and DAC 101D. Optionally, reset signal 144 may not be provided to DAC 101D, since when a reset is asserted, associated data has settled to its "new" value, at which point in time such "new" data may have been clocked in by DAC 101D. However, for purposes of clarity and not limitation, it shall be assumed that reset signal 144 is provided to DAC 101D.

Figure 3:
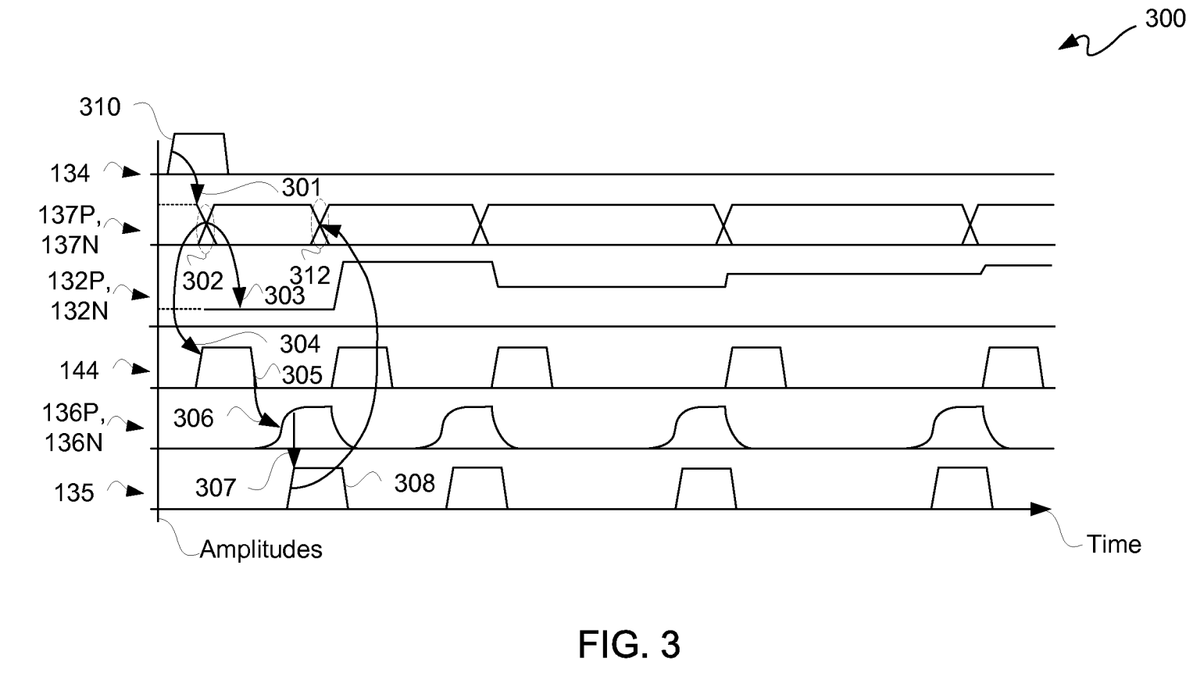
FIG. 3 is a signal diagram depicting an exemplary self-timed signal sequence for the ADC of FIG. 2.

FIG. 3 is a signal diagram depicting an exemplary self-time signal sequence 300 for ADC 100D of FIG. 2. Again, for an asynchronous self-timed SAR ADC 100D, a sample clock rate at N times a sampling clock frequency is not required, which may be a considerable advantage, especially for high-speed SAR ADCs. Even though ADC 100D is described, such description is similarly applicable to ADC 100 of FIG. 1. With simultaneous reference to FIGS. 2 and 3, self-time signal sequence 300 is further described.

A sampling pulse 310 of sampling clock signal 134 has a rising edge 301, which may cause a differential output of digital output signals 137P and 137N to transition at 302, such as due to clocking registers of control block 109D. Transition at 302 of digital output signals 137P and 137N fed back to DAC 101D may cause a differential output of analog output signals 132P and 132N of DAC 101D to go to an output level 303. A pulse 304 of reset signal 144 may be asserted by SAR control logic in control block 109D after such SAR control logic has sufficiently settled. This reset signal 144 may reset comparator 108D and optionally may also be used to clock in another or next data sample into DAC 101D for a next bit conversion cycle. A falling edge 305 of pulse 304 may cause comparator 108D to output a pulse 306 for a differential digital output of comparator digital output signals 136P and 136N of comparator 108D. Once comparator 108D has progressed sufficiently far along in making a decision, namely is no longer in a metastable state, at time 307, comparator 108D may assert a pulse 308 of ready signal 135 to control block 109D. This ready signal 135 may, though need not, have a clock pattern as such signal effectively just triggers a cascade of events in control block 109D; however, ready signal 135 may be used to clock SAR control logic in control block 109D in this example. A rising edge of pulse 308 may cause a transition at 312 of digital output signals 137P and 137N.

In this example, successive approximations are used for multiple self-timed cycles within a loop for a sampling pulse 310. In this example, spacing between transitions of digital output signals 137P and 137N get progressively further apart corresponding to aperiodic spacing of pulses of reset signal 144, digital output signals 136P and 136N, and ready signal 135. Furthermore, spacing between transitions of digital output signals 137P and 137N affect level of analog output signals 132P and 132N, which in this example generally progresses to higher levels from an initial level.

Figure 4:
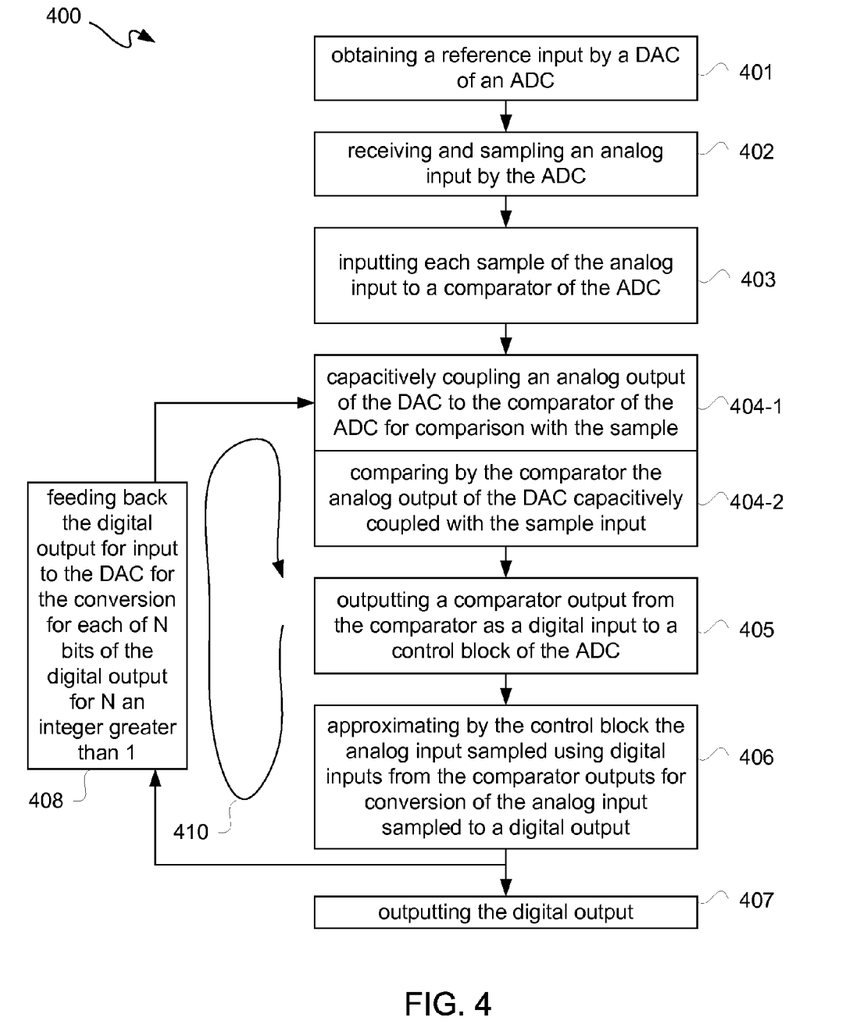
FIG. 4 is a flow diagram depicting an exemplary analog-to-digital conversion flow in accordance with FIGS. 1 through 3.

FIG. 4 is a flow diagram depicting an exemplary analog-to-digital conversion flow 400 in accordance with FIGS. 1 through 3. However, for purposes of clarity by way of example and not limitation, FIG. 4 is further described with simultaneous reference to ADC 100D of FIGS. 2 and 4 without loss of applicability to the description of FIGS. 1 and 3.

At 401, a reference input signal 131 may be obtained by DAC 101D of ADC 100D. At 402, an analog input, such as a differential analog input on analog input signals 142P and 142N, may be received by ADC 100D, where ADC 100D is configured for successive approximations. More particularly, at 402, a sample of an analog input signal may be obtained for the start of a bit trial sequence. Along those lines, at 402 a received analog input 142P and 142N is sampled by ADC 100D at the start of an N-bit conversion period, namely for a first bit. More particularly for a bit sequence, an analog sample of an analog input is sampled at the start of each conversion period or cycle. This sampling may be performed responsive to assertion of a reference clock edge, which reference clock edge is either related to a sample clock or a reset clock, or more generally a signal with a pattern for sampling or resetting in accordance with the description herein.

At 403, each sample of an analog input sampled at 402 is input to comparator 108D of ADC 100D. Again, this inputting to comparator for comparison by comparator 108D may effectively be sampling or comparing against an offset of an analog output of DAC 101D.

At 404-1, an analog output, such as a differential analog output of analog output signals 132P and 132N, of DAC 101D may be capacitively coupled for input to comparator 108D of ADC 100D. Such analog output provided at 403 may be generated with feedback from 408, as described below in additional detail. For a first cycle or start of a conversion period, a sample of an analog input signal may be input to comparator 108D without any offset, but on a subsequent cycle or bit-cycle for an N-bit conversion sequence there may be an offset present. Along those lines, at 404-1 it shall be assumed for purposes of clarity and not limitation that sampling at 402 has looped through ADC 100D for a first bit cycle for capacitive coupling at 404. At 404-2, an analog output from DAC 101D capacitively coupled to comparator 108D at 404-1 is effectively provided as a reference level for comparison by comparator 108D against a sample obtained at 403, namely a comparison between both input ports to comparator 108D. Again, this comparison at 404-2 may be considered as comparing a sample taken against an offset of an analog output of DAC 101D. As described below in additional detail regarding successive approximations, an analog output from DAC 101D may be shifted to a level that approximates a sampled analog input. In an implementation, such approximation may be within approximately 1 LSB after N bit trials.

At 405, a comparator output, such as a differential digital output of comparator output signals 136P and 136, from comparator 108D may be output as a digital input to control block 109D of ADC 100D. At 406, a portion, such as a bit for example, of such digital input may be used for an approximation by control block 109D for conversion of an analog input received at 402 to a digital output, such as a differential digital output sourced at digital output nodes 110P and 110N. More generally, an analog sampled value of an analog input received and sampled at 402 is successively approximated by iterating around loop 410 to obtain a digital equivalent to provide a digital output. Thus, with successive iterations or successive approximations, control block 109D may approximate an analog input sampled using digital inputs from comparator outputs for conversion of an analog input sampled to a digital output. At 407, such digital output approximated, or successively approximated, at 406 may be output to an output interface, such as may include digital output nodes 110P and 110N.

For successive bit-by-bit processing for each bit of N bits of an N bit ADC 100D, at 408 a digital output may be fed back for input to DAC 101D in a feedback loop for conversion for each bit of N bits of such digital output for N an integer greater than 1. Along those lines, N iterations around loop 410 may be performed to resolve a digital output of N-bits. Accordingly, there may be N cycles to generate N bits of a bit trial sequence to produce a complete digital output for output at 407 for a sample of an analog input signal obtained at 402.

Because one or more of the examples described herein may be implemented in an FPGA, a detailed description of such an IC is provided. However, it should be understood that other types of ICs may benefit from the technology described herein.

Programmable logic devices ("PLDs") may be a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic may be typically programmed by loading a stream of configuration data into internal configuration memory cells that define how the programmable elements may be configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs may be programmed by applying a processing layer, such as a metal layer, that programmably interconnects the various elements on the device. These PLDs may be known as mask programmable devices. PLDs can also be implemented in other ways, e.g., using fuse or antifuse technology. The terms "PLD" and "programmable logic device" include but may be not limited to these exemplary devices, as well as encompassing devices that may be only partially programmable. For example, one type of PLD includes a combination of hard-coded transistor logic and a programmable switch fabric that programmably interconnects the hard-coded transistor logic.

Figure 5:
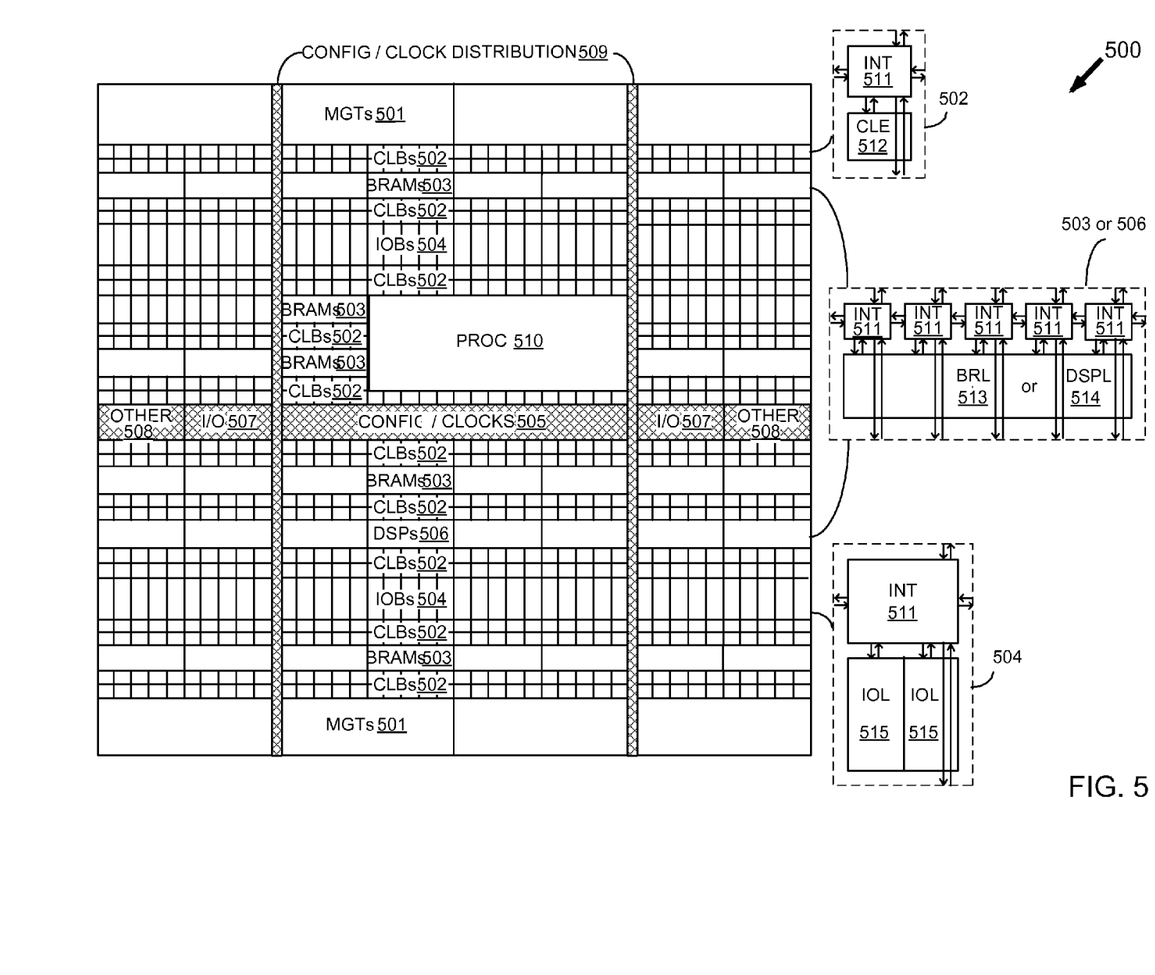
FIG. 5 is a simplified block diagram depicting an exemplary columnar Field Programmable Gate Array ("FPGA") architecture.

As noted above, advanced FPGAs can include several different types of programmable logic blocks in the array. For example, FIG. 5 illustrates an FPGA architecture 500 that includes a large number of different programmable tiles including multi-gigabit transceivers ("MGTs") 501, configurable logic blocks ("CLBs") 502, random access memory blocks ("BRAMs") 503, input/output blocks ("IOBs") 504, configuration and clocking logic ("CONFIG/CLOCKS") 505, digital signal processing blocks ("DSPs") 506, specialized input/output blocks ("I/O") 507 (e.g., configuration ports and clock ports), and other programmable logic 508 such as digital clock managers, analog-to-digital converters, system monitoring logic, and so forth. Some FPGAs also include dedicated processor blocks ("PROC") 510.

In some FPGAs, each programmable tile includes a programmable interconnect element ("INT") 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 can include a configurable logic element ("CLE") 512 that can be programmed to implement user logic plus a single programmable interconnect element ("INT") 511. A BRAM 503 can include a BRAM logic element ("BRL") 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element ("DSPL") 514 in addition to an appropriate number of programmable interconnect elements. An IOB 504 can include, for example, two instances of an input/output logic element ("IOL") 515 in addition to one instance of the programmable interconnect element 511. As will be clear to those of skill in the art, the actual I/O pads connected, for example, to the I/O logic element 515 typically may be not confined to the area of the input/output logic element 515.

In the pictured embodiment, a horizontal area near the center of the die (shown in FIG. 5) is used for configuration, clock, and other control logic. Vertical columns 509 extending from this horizontal area or column may be used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 510 spans several columns of CLBs and BRAMs.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 may be purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks may be the property of their respective owners.

What is claimed is:

1. An apparatus, comprising:
   an analog-to-digital converter ("ADC") configured for successive approximations;
   wherein the ADC comprises a digital-to-analog converter ("DAC"), a comparator, and a control block;
   wherein the DAC is coupled to receive a first reference input signal and a feedback input signal to provide an analog output signal;
   wherein the analog output signal is capacitively coupled to an analog input node through a capacitor;
   wherein the analog input node is coupled through a switch to sample an analog input signal;
   wherein the capacitor is coupled between an output port of the DAC and a first input port of the comparator to provide capacitive coupling therebetween;
   wherein the first input port of the comparator is further coupled to the analog input node;
   wherein a second input port of the comparator is coupled to receive a second reference input signal;
   wherein the comparator is coupled to provide a comparator output signal to the control block;
   wherein the control block is configured for successive approximations to provide a digital output signal to a digital output node; and
   wherein the DAC is coupled to the digital output node to receive the digital output signal as the feedback input signal.

2. The apparatus according to claim 1, wherein a top plate the capacitor is coupled to the analog input node.

3. The apparatus according to claim 1, wherein the DAC is a current steering DAC.

4. The apparatus according to claim 3, wherein the ADC is a switched-current successive-approximation-register ADC.

5. The apparatus according to claim 4, wherein the first reference input is a current reference input.

6. The apparatus according to claim 1, wherein:
   the first reference input is a first voltage reference input; and
   the second reference input is a second voltage reference input.

7. The apparatus according to claim 1, wherein the comparator is coupled to sample against an offset of the DAC.

8. The apparatus according to claim 1, wherein:
   the DAC and the comparator are coupled to receive a reset signal from the control block; and
   the comparator is coupled to provide a ready signal to the control block for a self-timed asynchronous configuration.

9. An apparatus, comprising:
   an analog-to-digital converter ("ADC") configured for successive approximations;
   wherein the ADC comprises a digital-to-analog converter ("DAC"), a comparator, and a control block;
   wherein the DAC is coupled to receive a reference input signal and coupled to provide a first analog output signal and a second analog output signal as a differential output;
   wherein the first analog output signal is capacitively coupled to a first analog input node through a first capacitor;
   wherein the second analog output signal is capacitively coupled to a second analog input node through a second capacitor;
   wherein the first capacitor is coupled between the DAC and the comparator to provide a first capacitive coupling therebetween;
   wherein the second capacitor is coupled between the DAC and the comparator to provide a second capacitive coupling therebetween;
   wherein the comparator is coupled to the first analog input node and coupled to provide a first comparator output signal to the control block;
   wherein the comparator is coupled to the second analog input node and coupled to provide a second comparator output signal to the control block;
   wherein the control block is configured for successive approximations to provide a first digital output signal to a first digital output node and to provide a second digital output signal to a second digital output node; and
   wherein the DAC is coupled to the first digital output node and the second digital output node to respectively receive the first digital output signal as a first feedback input signal and the second digital output signal as a second feedback input signal.

10. The apparatus according to claim 9, wherein a top plate of each of the first capacitor and the second capacitor is respectively coupled to the first analog input node and the second analog input node.

11. The apparatus according to claim 9, wherein the DAC is a current steering DAC.

12. The apparatus according to claim 11, wherein the ADC is a switched-current successive-approximation-register ADC.

13. The apparatus according to claim 9, wherein the first analog output and the second analog output in combination provide a fully-differential output.

14. The apparatus according to claim 9, wherein the comparator is coupled to sample against an offset of the DAC.

15. The apparatus according to claim 9, wherein:
   the DAC and the comparator are coupled to receive a reset signal from the control block; and
   the comparator is coupled to provide a ready signal to the control block for a self-timed asynchronous configuration.

16. A method, comprising:
   obtaining a reference input by a digital-to-analog converter ("DAC") of an analog-to-digital converter ("ADC");
   receiving and sampling an analog input by the ADC;
   inputting each sample of the analog input to a comparator of the ADC;
   capacitively coupling an analog output of the DAC to the comparator of the ADC;
   comparing by the comparator the analog output of the DAC capacitively coupled with the sample input;
   wherein comparison by the comparator is against an offset of the analog output of the DAC;
   outputting a comparator output from the comparator as a digital input to a control block of the ADC;

approximating by the control block the analog input sampled using digital inputs from the comparator outputs for conversion of the analog input sampled to a digital output; and outputting the digital output to an output interface; and feeding back the digital output for input to the DAC for the conversion for each of N bits of the digital output for N an integer greater than 1 for successive approximations for the step of approximating to provide the N bits of the digital output.

17. The method according to claim 16, wherein the DAC is a current steering DAC.

18. The method according to claim 17, wherein the analog input and the digital output are both differential.

19. The method according to claim 17, wherein the analog output of the DAC is capacitively coupled through respective unswitched alternating current "AC") coupled capacitors between the DAC and the comparator.

* * * * *